United States Patent
Chen et al.

(10) Patent No.: US 11,487,150 B2
(45) Date of Patent: Nov. 1, 2022

(54) DISPLAY PANEL AND DISPLAY DEVICE

(71) Applicants: BEIHAI HKC OPTOELECTRONICS TECHNOLOGY CO., LTD., Beihai (CN); HKC CORPORATION LIMITED, Shenzhen (CN)

(72) Inventors: Cheng-hung Chen, Beihai (CN); Wei Li, Beihai (CN)

(73) Assignees: BEIHAI HKC OPTOELECTRONICS TECHNOLOGY CO., LTD., Beihai (CN); HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/384,333

(22) Filed: Jul. 23, 2021

(65) Prior Publication Data

US 2022/0035201 A1  Feb. 3, 2022

(30) Foreign Application Priority Data

Jul. 28, 2020 (CN) .......................... 202010735670.3
Jul. 28, 2020 (CN) .......................... 202021521329.X (51) Int. Cl.
*G02F 1/13* (2006.01)
*G02F 1/1335* (2006.01)
*H01L 27/32* (2006.01)
*H01L 51/52* (2006.01)

(52) U.S. Cl.
CPC .... *G02F 1/133528* (2013.01); *H01L 27/3239* (2013.01); *H01L 51/5253* (2013.01); *H01L 51/5281* (2013.01); *G02F 1/133512* (2013.01)

(58) Field of Classification Search
CPC ......... G02F 1/133528; G02F 1/133512; H01L 27/3239; H01L 51/5253; H01L 51/5281
See application file for complete search history.

(56) References Cited

U.S. PATENT DOCUMENTS

2013/0301272 A1* 11/2013 Wang .................... G06F 1/1656
                                                             362/293
2018/0267345 A1*  9/2018 Chen ................. G02F 1/133528

* cited by examiner

*Primary Examiner* — Anne M Hines
(74) *Attorney, Agent, or Firm* — Westbridge IP LLC (57) ABSTRACT

Disclosed are a display panel and a display device. The display panel includes a panel body, the panel body including a display area and a non-display area around a periphery of the display area; and a decoration portion provided on the panel body and located in the display area.

8 Claims, 6 Drawing Sheets

DISPLAY PANEL AND DISPLAY DEVICE

CROSS-REFERENCE TO RELATED APPLICATIONS

This application claims priority to Chinese Patent Application Nos. 202010735670.3 and 202021521329.X, both filed on Jul. 28, 2020, the entire disclosures of which are incorporated herein by reference.

TECHNICAL FIELD

The present disclosure relates to the technical field of display devices, in particular to a display panel and a display device applying the display panel.

BACKGROUND

The display device has many advantages such as thin body, power saving, and no radiation, and has been widely used in, such as: mobile phones, personal digital assistants (PDAs), digital cameras, televisions, computer screens or laptop screens.

As the display device becomes increasingly popular, the requirements for the aesthetics of the display device are higher. Nowadays, in order to make the appearance of the display device more beautiful and technological, people are pursuing a borderless display panel, and hope that the non-display area (or shading area) is as small as possible. However, as the shading area of the panel of a TV or monitor becomes smaller and smaller, reluctantly pasting the brand logo is not conducive to the recognition of the logo, and reluctantly pasting the brand logo on the shading area of the panel will destroy the overall appearance of the panel.

The above content is only used to assist the understanding of the technical solution of the present disclosure, which does not mean that the above content is recognized as prior art.

SUMMARY

The main objective of the present disclosure is to provide a display panel, which aims to provide a display panel that is conducive to logo recognition and does not affect the overall appearance of the panel.

In order to achieve the above objective, the present disclosure provides a display panel, including: a panel body, the panel body including a display area and a non-display area around a periphery of the display area; and a decoration portion provided on the panel body and located in the display area.

The present disclosure further provides a display device including the display panel described above.

In technical solutions of the present disclosure, the decoration portion is provided in the display area of the panel body, which not only helps to improve the logo recognition of the decoration portion, but also prevents the decoration portion from destroying the overall appearance of the panel body. Further, the non-display area surrounds the periphery of the display area, that is, the non-display area is provided around the periphery of the display area, which is beneficial to increase the display area of the panel body, thereby improving the appearance and the sense of technology of the display panel. Meanwhile, the decoration portion is provided in the display area of the panel body and adjacent to the non-display area, which improves the logo recognition of the decoration portion without affecting the display effect of the display panel.

BRIEF DESCRIPTION OF THE DRAWINGS

In order to more clearly illustrate the embodiments of the present disclosure, drawings used in the embodiments will be briefly described below. Obviously, the drawings in the following description are only some embodiments of the present disclosure. It will be apparent to those skilled in the art that other figures can be obtained according to the structures shown in the drawings without creative work.

The realization of the objective, functional characteristics, and advantages of the present disclosure are further described with reference to the accompanying drawings.

DETAILED DESCRIPTION OF THE EMBODIMENTS

The technical solutions of the embodiments of the present disclosure will be described in more detail below with reference to the accompanying drawings. It is obvious that the embodiments to be described are only some rather than all of the embodiments of the present disclosure. All other embodiments obtained by persons skilled in the art based on the embodiments of the present disclosure without creative efforts shall fall within the scope of the present disclosure.

It should be noted that if there is a directional indication (such as up, down, left, right, front, rear . . . ) in the embodiments of the present disclosure, the directional indication is only used to explain the relative positional relationship, movement, etc. of the components in a certain posture (as shown in the drawings). If the specific posture changes, the directional indication will change accordingly.

In the present disclosure, unless clearly specified and limited, the terms "connected", "fixed", etc. should be interpreted broadly. For example, "fixed" can be a fixed connection, a detachable connection, or integrated a whole; can be a mechanical connection or an electrical connection; can be a direct connection; can also be indirectly connected through an intermediate; and can be the internal communication between two elements or the interaction between two elements. A person of ordinary skill in the art can understand the specific meaning of the above-mentioned terms in the present disclosure according to the specific situation.

Besides, the meaning of "and/or" appearing in the disclosure includes three parallel scenarios. For example, "A and/or B" includes only A, or only B, or both A and B. The descriptions associated with, e.g., "first" and "second," in the present disclosure are merely for descriptive purposes, and cannot be understood as indicating or suggesting relative importance or impliedly indicating the number of the indicated technical feature. Therefore, the feature associated with "first" or "second" can expressly or impliedly include at least one such feature. In addition, the technical solutions between the various embodiments can be combined with each other, but they must be based on the realization of those of ordinary skill in the art. When the combination of technical solutions is contradictory or cannot be achieved, it should be considered that such a combination of technical solutions does not exist, nor does it fall within the scope of the present disclosure.

The present disclosure provides a display panel. It can be understood that the display panel 100 may be a liquid crystal display panel or an organic light-emitting diode display panel.

As shown in FIG. 1 to FIG. 5, in some embodiments of the present disclosure, the display panel 100 includes a panel body 1 and a decoration portion 2. The panel body 1 has a display area 1*a* and a non-display area 1*b* around a periphery of the display area 1*a*. The decoration portion 2 is provided on the panel body 1 and located in the display area 1*a*.

Figure 1:
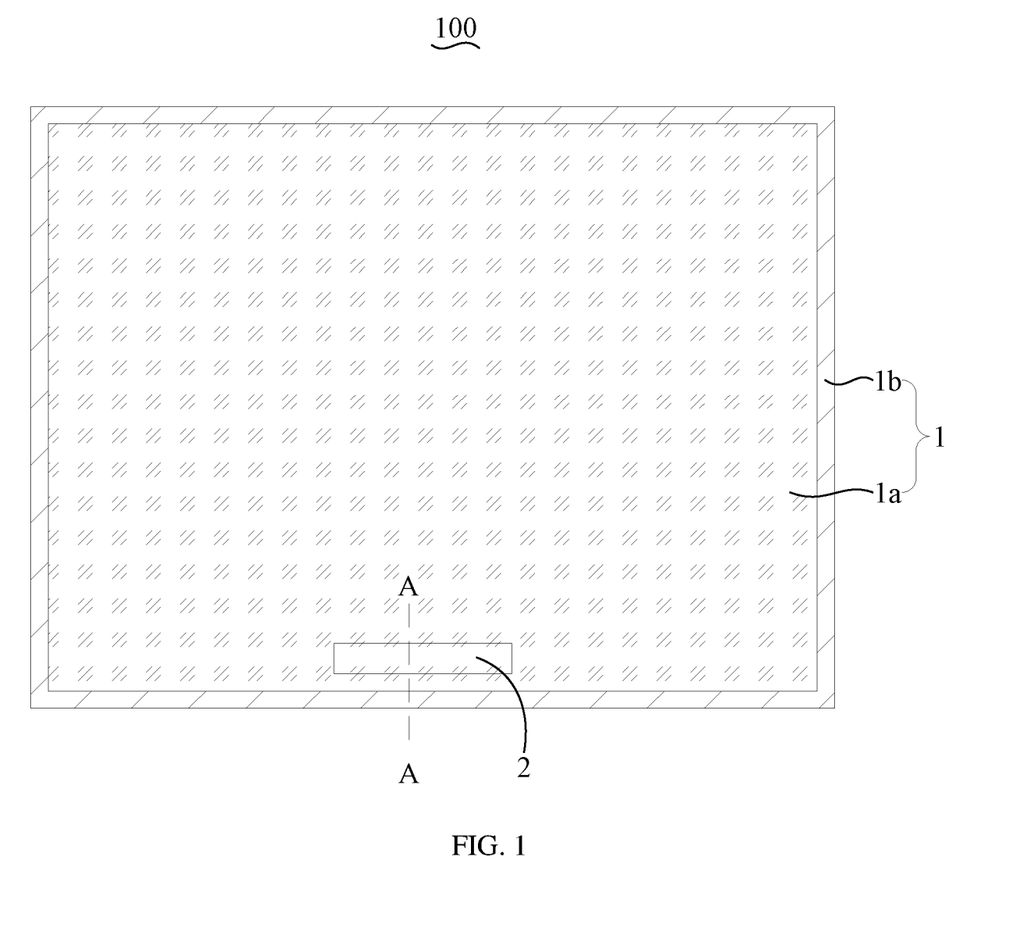
FIG. 1 is a schematic structural diagram of a display panel according to an embodiment of the present disclosure.

In this embodiment, the display panel 100 is a borderless display panel, that is, the periphery of the display panel 100 is not provided with a border. As people have higher and higher requirements for the aesthetics of the display panel 100, the borderless display panel not only has a more beautiful appearance, but also has a more technological sense. In order to increase the display range of the display panel 100 and improve the user's visual effect, the non-display area 1*b* of the display panel 100 is smaller and smaller, and the non-display area 1*b* is provided at the periphery of the display area 1*a*, that is, the non-display area 1*b* is provided around the periphery of the display area 1*a*.

As the non-display area 1*b* becomes smaller, continuing to stick the brand logo of the display panel 100 (that is, the decoration portion 2) barely covering the non-display area 1*b* will cause the brand logo of the display panel 100 to be unfavorable for making, and will not be conducive to the recognition of the logo, and will destroy the overall appearance of the display panel 100.

In the present disclosure, the decoration portion 2 is provided in the display area 1*a* of the panel body 1, which not only helps to improve the logo recognition of the decoration portion 2, but also prevents the decoration portion 2 from destroying the overall appearance of the panel body 1. Further, the non-display area 1*b* surrounds the periphery of the display area 1*a*, that is, the non-display area 1*b* is provided around the periphery of the display area 1*a*, which is beneficial to increase the display area 1*a* of the panel body 1, thereby improving the appearance and the sense of technology of the display panel 100. Meanwhile, the decoration portion 2 is provided in the display area 1*a* of the panel body 1 and adjacent to the non-display area 1*b*, which improves the logo recognition of the decoration portion 2 without affecting the display effect of the display panel 100.

It can be understood that the decoration portion 2 may be a logo or a sign. That is, the decoration portion 2 may be a brand mark or logo of the display panel 100, such as a brand LOGO, an icon, a hollow pattern or a decoration layer, etc., which is not limited herein. In this embodiment, the decoration portion 2 may be provided on the surface of the panel body 1, which facilitates the processing, installation and attachment of the decoration portion 2.

In order to maintain the service life of the decoration portion 2 and improve the appearance of the display panel 100, the decoration portion 2 may also be provided in the panel body 1. In an embodiment of the present disclosure, the decoration portion 2 is embedded in the panel body 1 and located in the display area 1*a*. It can be understood that the decoration portion 2 can be embedded in the surface of the panel body 1, that is, the decoration portion 2 is flush with the surface of the panel body 1. The decoration portion 2 may also be embedded inside the panel body 1, for example, the decoration portion 2 is between both substrates of the panel body 1, and the like.

In an embodiment of the present disclosure, as shown in FIG. 2 to FIG. 5, the panel body 1 includes a first polarizer 11, a second polarizer 12 opposite to the first polarizer 11, and a first black matrix 16 between the first polarizer 11 and the second polarizer 12. The first black matrix 16 corresponds to the non-display area 1*b*. The decoration portion 2 is between the first polarizer 11 and the second polarizer 12, and is spaced apart from the first black matrix 16.

It can be understood that the display panel 100 in this embodiment is a liquid crystal display panel. The panel body 1 is provided with a first black matrix 16 corresponding to the non-display area 1*b*. Since the first black matrix 16 cannot transmit light, the area corresponding to the first black matrix 16 forms the non-display area 1*b* of the panel body 1, that is, the area of the first black matrix 16 is the same as the area of the non-display area 1*b*. In this embodiment, the decoration portion 2 is between the first polarizer 11 and the second polarizer 12, such that the decoration portion 2 is displayed on the display panel 100 through the first polarizer 11 or the second polarizer 12, so as to realize the logo recognition of the decoration portion 2. The decoration portion 2 is embedded in the panel body 1 to protect the decoration portion 2 while also helping to maintain the service life of the decoration portion 2.

In an embodiment, as shown in FIG. 2 to FIG. 5, the panel body 1 further includes a color film substrate 13 and an array substrate 14 opposite to the color film substrate 13. The color film substrate 13 and the array substrate 14 are provided between the first polarizer 11 and the second polarizer 12. The first polarizer 11 is located on a side of the color film substrate 13 away from the array substrate 14. The second polarizer 12 is located on a side of the array substrate 14 away from the color film substrate 13. The first black matrix 16 is between the color film substrate 13 and the array substrate 14.

In this embodiment, the panel body 1 further includes a liquid crystal layer 15 provided between the color film substrate 13 and the array substrate 14. It can be understood that the color film substrate 13 of the panel body 1 is opposite to the array substrate 14, and the liquid crystal layer 15 is between the array substrate 14 and the color film substrate 13. In order to protect and define the liquid crystal layer 15, the panel body 1 further includes a plastic frame 17 provided between the array substrate 14 and the color film substrate 13, and the plastic frame 17 is provided around the periphery of the liquid crystal layer.

In an embodiment, the color film substrate 13 and the array substrate 14 are both transparent substrates, such as glass substrates, quartz substrates, and the like. In the actual process, there are often a large number of metal traces on the array substrate 14. That is, a plurality of scan lines and a plurality of data lines are formed on the array substrate 14, and the plurality of scan lines and the plurality of data lines are insulated and crossed to define a plurality of pixel units. The plurality of pixel units are in an array on the array substrate, and the plurality of pixel units are located in the display area 1*a* of the display panel 100. Since the metal traces on the periphery of the array substrate 14 will cause obvious reflection, adversely affect the visual effect of the display panel 100 and affect the viewing experience of users, in this embodiment, the first black matrix 16 is between the color film substrate 13 and the array substrate 14, so that the first black matrix 16 is used to shield the reflection of the metal traces on the array substrate 14.

In this embodiment, the surface of the color film substrate 13 away from the array substrate 14 is the light-emitting surface. The first polarizer 11 is located on the side of the color film substrate 13 away from the array substrate 14, that is, the first polarizer 11 covers the light-emitting surface of the color film substrate 13. The second polarizer 12 is located on the side of the array substrate 14 away from the color film substrate 13, and is used to protect the array substrate 14. That is, the color film substrate 13 and the array substrate 14 are provided between the first polarizer 11 and the second polarizer 12. The first polarizer 11 and the second polarizer 12 can protect the color film substrate 13 and the array substrate 14, and can also use the first polarizer 11 and the second polarizer 12 to transmit light to the display panel 100.

Figure 2:
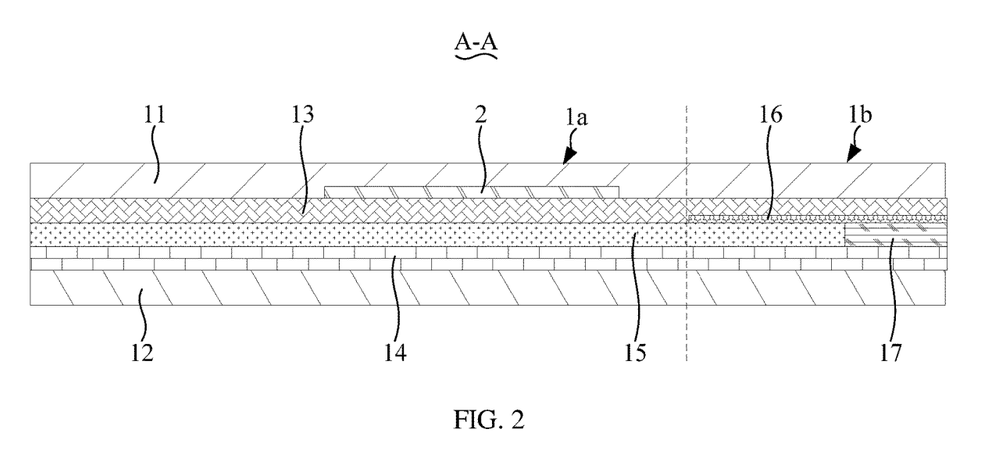
FIG. 2 is a schematic cross-sectional view taken along A-A in FIG. 1 according to a first embodiment.

In an embodiment of the present disclosure, as shown in FIG. 2, the decoration portion 2 is between the first polarizer 11 and the color film substrate 13. It is understandable that the decoration portion 2 is between the light-emitting surface of the color film substrate 13 and the first polarizer 11, and is located in the display area 1a. On the one hand, the decoration portion 2 is embedded in the display panel 100, which is beneficial to protect the decoration portion 2. On the other hand, the decoration portion 2 reflects and transmits light from the light-emitting surface of the color film substrate 13, thereby effectively improving the logo recognition of the decoration portion 2.

Figure 5:
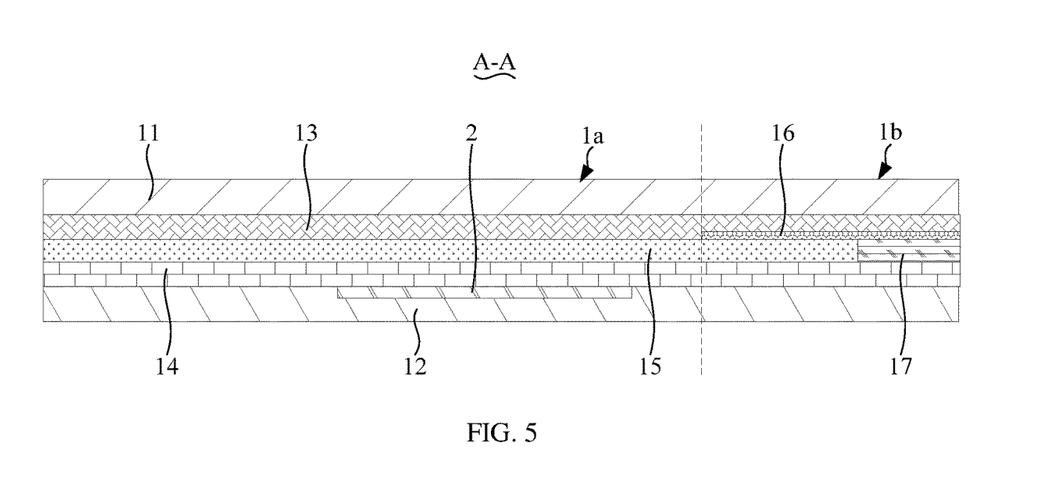
FIG. 5 is a schematic cross-sectional view taken along A-A in FIG. 1 according to a fourth embodiment.

In an embodiment of the present disclosure, as shown in FIG. 5, the decoration portion 2 is between the second polarizer 12 and the array substrate 14. It is understandable that the decoration portion 2 is between the second polarizer 12 and the array substrate 14 and is located in the display area 1a. On the one hand, the decoration portion 2 is embedded in the display panel 100, which is beneficial to protect the decoration portion 2. On the other hand, the logo recognition of the decoration portion 2 is improved.

Figure 3:
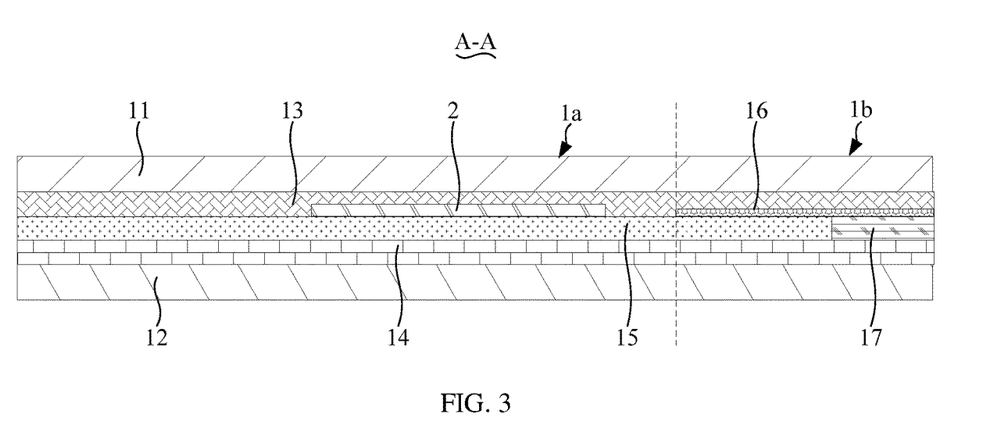
FIG. 3 is a schematic cross-sectional view taken along A-A in FIG. 1 according to a second embodiment.
Figure 4:
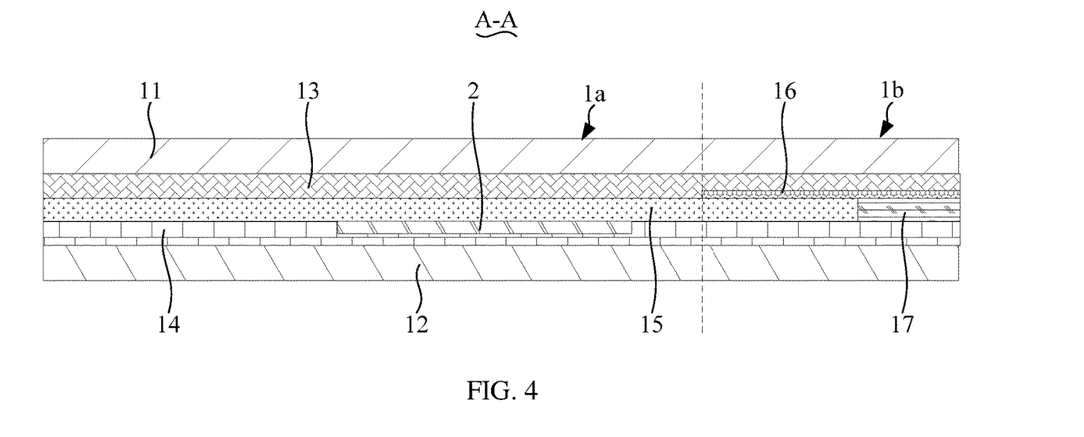
FIG. 4 is a schematic cross-sectional view taken along A-A in FIG. 1 according to a third embodiment.

In an embodiment of the present disclosure, as shown in FIG. 3 and FIG. 4, the decoration portion 2 is between the color film substrate 13 and the array substrate 14, and is spaced apart from the first black matrix 16.

In order to make the decoration portion 2 be embedded in the display panel 100 and improve the logo recognition of the decoration portion 2, the decoration portion 2 is made of a highly reflective metal material, such as aluminum, silver or a highly reflective composite material. To further improve the logo recognition of the decoration portion 2, the light transmittance of the decoration portion 2 should reach about 50%, that is, the transmittance of the decoration portion 2 is greater than or equal to 50%. Meanwhile, the reflectance of the decoration portion 2 is higher than the reflectance of the panel body 1. In an embodiment, the reflectance of the decoration portion 2 is 10% to 20%.

In this embodiment, the decoration portion 2 is layered. That is, the decoration portion 2 is a layer of metal material film or metal hollow layer, etc. between the first polarizer 11 and the color film substrate 13, or between the second polarizer 12 and the array substrate 14, or between the color film substrate 13 and the array substrate 14, which is not limited here.

In this embodiment, the scan lines and data lines on the array substrate 14 are perpendicular to each other. Multiple scan lines are spaced in parallel, and multiple data lines are spaced in parallel. Two adjacent data lines and two adjacent scan lines enclose one pixel unit. In an embodiment, both the scan line and the data line are made of conductive materials, such as aluminum alloy or chrome metal.

In an embodiment of the present disclosure, as shown in FIG. 3 and FIG. 4, the decoration portion 2 is between the color film substrate 13 and the array substrate 14, and the decoration portion 2 is provided on the color film substrate 13 or the array substrate 14. It can be understood that the decoration portion 2 is provided on the side of the color film substrate 13 facing the array substrate 14, that is, the decoration portion 2 is provided on the color film substrate 13. The decoration portion 2 may also be provided on the side of the array substrate 14 facing the color film substrate 13, that is, the decoration portion 2 is provided on the array substrate 14, which is not limited here. In order to prevent the metal decoration portion 2 from affecting the scan lines and data lines on the array substrate 14 or the metal traces on the color film substrate 13, when the decoration portion 2 is between the color film substrate 13 and the array substrate 14, an insulation layer is between the decoration portion 2 and the color film substrate 13 and/or the array substrate 14, avoiding that the scan lines on the decoration portion 2 and the array substrate 14 are conductive with the data lines or the metal traces on the color film substrate 13.

It can be understood that each pixel unit includes a switching element and a pixel electrode, and the pixel electrode is electrically connected to the corresponding scan line and data line through the switching element. The switching element is a thin film transistor, which includes a gate, a source and a drain. The gate is electrically connected to the corresponding scan line. The gate and the scan line are generally made of the same material. The source electrode is electrically connected to the corresponding data line, and the drain is electrically connected to the corresponding pixel electrode.

The source, the drain and the data line are generally made of the same material. The thin film transistor also includes an active layer. The active layer may include a semiconductor layer and a doped semiconductor layer, located below the source and the drain, and above the gate. All the doped semiconductor layer and part of the semiconductor layer between the source and the drain are etched to form a TFT channel.

Specially, when the gate is connected to a high level voltage, the source and the drain are conducted through the active layer, and the image signal voltage in the data line is connected to the pixel electrode. In order to maintain insulation between the conductive structures, the insulation layer covering the scan line and the gate is a gate insulation layer, and the insulation layer covering the data line, the active layer, the source and the drain is a passivation layer. The pixel electrode is formed on the passivation layer, and the pixel electrode is connected to the drain electrode through the via hole on the passivation layer. The pixel electrode may be a semi-transparent electrode or a reflective electrode. When the pixel electrode is a semi-transparent electrode, the pixel electrode may include a transparent conductive layer.

It can be understood that the transparent conductive layer may include, for example, at least one of indium tin oxide (ITO), indium zinc oxide (IZO), zinc oxide (ZnO), indium oxide ($In_2O_3$), indium gallium oxide (IGO), and aluminum zinc oxide (AZO). In addition to the transparent conductive layer, the pixel electrode may include a transflective layer for improving luminous efficiency. The transflective layer can be a thin layer (for example, a few nanometers to tens of nanometers), and may include at least one of Ag, Mg, Al, Pt, Pd, Au, Ni, Nd, Jr, Cr, Li, Ca, and Yb.

In an embodiment of the present disclosure, the first black matrix 16 is provided on the color film substrate 13 or on the array substrate 14, and the first black matrix 16 surrounds the display area 1a. Understandably, as shown in FIG. 2 to FIG. 5, the first black matrix 16 is provided on the side of the color film substrate 13 facing the array substrate 14, that is, the first black matrix 16 is provided on the color film substrate 13. The first black matrix 16 may also be provided on the side of the array substrate 14 facing the color film substrate 13, that is, the first black matrix 16 is provided on the array substrate 14, which is not limited herein.

Figure 6:
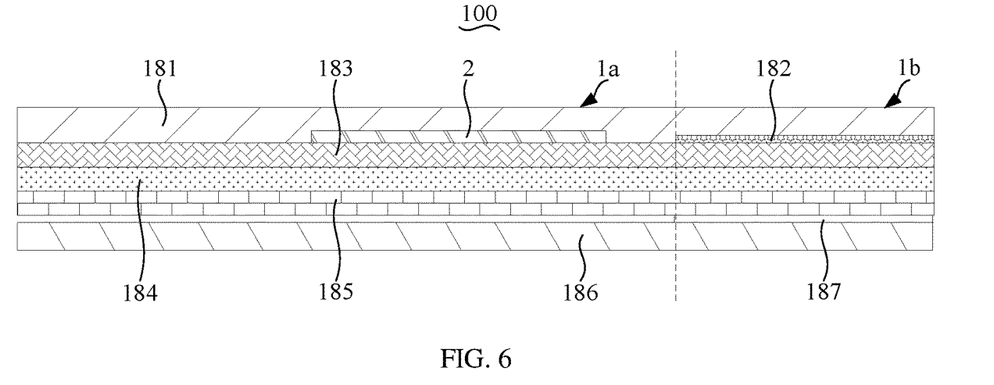
FIG. 6 is a schematic structural diagram of the display panel according to another embodiment of the present disclosure.

In another embodiment of the present disclosure, as shown in FIG. 6, the panel body 1 includes a third polarizer 181, a second black matrix 182, a first substrate 183, and an organic light-emitting element layer 184 stacked in sequence. The second black matrix 182 corresponds to the non-display area 1. The decoration portion 2 is between the third polarizer 181 and the first substrate 183 and is spaced apart from the second black matrix 182.

It can be understood that the display panel 100 in this embodiment is an organic light-emitting diode display panel. The panel body 1 is provided with a second black matrix 182 corresponding to the non-display area 1b. Since the second black matrix 182 cannot transmit light, the area corresponding to the second black matrix 182 forms the non-display area 1b of the panel body 1, that is, the area of the second black matrix 182 is the same as the area of the non-display area 1b.

In this embodiment, the decoration portion 2 is between the third polarizer 181 and the first substrate 183, such that the decoration portion 2 is displayed on the display panel 100 through the third polarizer 181, so as to realize the logo recognition of the decoration portion 2. The decoration portion 2 is embedded in the panel body 1 to protect the decoration portion 2 while also helping to maintain the service life of the decoration portion 2.

It can be understood that the first substrate 183 is a transparent substrate, such as a glass substrate, a quartz substrate, and the like. The first substrate 183 may also be a color film substrate or an array substrate, which is not limited herein. The surface of the first substrate 183 away from the organic light-emitting element layer 184 is the light-emitting surface. The third polarizer 181 is located on the side of the first substrate 183 away from the organic light-emitting element layer 184, that is, the third polarizer 181 covers the light-emitting surface of the first substrate 183.

In this embodiment, the decoration portion 2 is between the light-emitting surface of the first substrate 183 and the third polarizer 181, and is located in the display area 1a. On the one hand, the decoration portion 2 is embedded in the display panel 100, which is beneficial to protect the decoration portion 2. On the other hand, the decoration portion 2 reflects and transmits light from the light-emitting surface of the first substrate 183, thereby effectively improving the logo recognition of the decoration portion 2.

In another embodiment of the present disclosure, as shown in FIG. 6, the panel body 1 further includes an encapsulation layer 185 and a second substrate 186. The encapsulation layer 185 is provided on the side of the organic light-emitting element layer 184 away from the first substrate 183. The second substrate 186 is provided on the side of the encapsulation layer 185 away from the organic light-emitting element layer 184.

It can be understood that the encapsulation layer 185 is provided on the side of the organic light-emitting element layer 184 away from the first substrate 183 for encapsulating the organic light-emitting element layer 184. In an embodiment, the encapsulation layer 185 is a tetrafluoroethylene film encapsulation layer (TFE film encapsulation layer), and the organic light-emitting element layer 184 may be an organic self-luminous layer.

In this embodiment, the panel body 1 further includes an aluminum foil between the encapsulation layer 185 and the second substrate 186. The second substrate 186 is used to protect the organic light-emitting element layer 184 and the encapsulation layer 185, and is used to realize the heat dissipation function for the panel body 1. In an embodiment, the second substrate 186 is an aluminum plate. It can be understood that the adhesive layer 187 is used to bond the second substrate 186 and the encapsulation layer 185.

In an embodiment of the present disclosure, a thickness of the decoration portion 2 is 10 nm to 20 nm. In an embodiment, the thickness of the decoration portion 2 is 10 nm, 11 nm, 12 nm, 13 nm, 14 nm, 15 nm, 16 nm, 17 nm, 18 nm, 19 nm, 20 nm. The thickness of the decoration portion 2 cannot be too thick or too thin. If the thickness of the decoration portion 2 is too thick, resulting in a waste of materials of the decoration portion 2, the light transmission performance of the decoration portion 2 will be affected, and thus the display effect of the display panel 100 will be affected. If the thickness of the decoration portion 2 is too thin, the logo recognition of the decoration portion 2 will be affected.

In an embodiment of the present disclosure, a display panel 100 includes a panel body 1 and a decoration portion 2. The panel body 1 includes a first polarizer 11, a color film substrate 13, a liquid crystal layer 15, an array substrate 14, and a second polarizer 12 stacked in sequence. The panel body 1 has a display area 1a and a non-display area 1b around a periphery of the display area 1a, and the panel body 1 further includes a first black matrix 16 provided on a side of the color film substrate 13 towards the array substrate 14. The first black matrix 16 corresponds to the non-display area 1b. The decoration portion 2 is between the first polarizer 11 and the color film substrate 13 and is located in the display area 1a.

It can be understood that the display panel 100 in this embodiment is a liquid crystal display panel. Embedding the decoration portion 2 in the panel body 1, i.e., embedding the decoration portion 2 between the first polarizer 11 and the color film substrate 13 is beneficial to protect the decoration portion 2 while improving the appearance of the display panel 100, and also beneficial to improve the logo recognition of the decoration portion 2. Meanwhile, providing the decoration portion 2 in the display area 1a effectively prevents the decoration portion 2 from destroying the overall appearance of the panel body 1.

In an embodiment, the decoration portion 2 is a brand mark or logo of the display panel 100. In this embodiment, the decoration portion 2 is plated on the light-emitting surface of the color film substrate 13, that is, the surface of the color film substrate 13 facing the first polarizer 11. The light-emitting surface of the color film substrate 13 is fabricated to form a metal layer. The material and thickness of the metal layer of the decoration portion 2 is adjusted to control the light transmission and reflection ratio of the decoration portion 2, such that the metal layer of the decoration portion 2 has a higher light reflectivity than other areas of the panel body 1 without the metal layer of the decoration portion 2, thereby having a logo recognition effect. When displaying the display panel 100, the metal layer area of the decoration portion 2 has a lower light transmittance than the metal layer area of the non-decorated portion 2, so that the decoration portion 2 has the display effect of the logo watermark.

In the present disclosure, the brand logo of the decoration portion 2 is embedded in the display area 1a of the panel body 1 (that is, the pixel area of the display panel 100), which effectively maintains the overall appearance of the display panel 100. The simplified appearance highlights the more fashionable and trendy sense of the display panel 100. In order to maintain the size of the logo of the decoration portion 2, the width of the non-display area 1b of the display panel 100 (that is, the light-shielding area of the display panel 100) or the size of the derivative structure of the display panel 100 will not be increased. The logo of the decoration portion 2 is embedded is the display area 1a of the panel body 1, which effectively save the cost of pasting the logo.

The present disclosure further provides a display device, including the above-mentioned display panel 100. Since the display device adopts all the technical solutions of all the foregoing embodiments, it has at least all the beneficial effects brought by the technical solutions of the foregoing embodiments, which will not be repeated here.

The above are only some embodiments of the present disclosure, and do not limit the scope of the present disclosure thereto. Under the inventive concept of the present disclosure, equivalent structural transformations made according to the description and drawings of the present disclosure, or direct/indirect application in other related technical fields are included in the scope of the present disclosure.

What is claimed is:

1. A display panel, comprising:
   a panel body comprising a display area and a non-display area around a periphery of the display area; and
   a decoration portion provided on the panel body and located in the display area;
   wherein, the panel body comprises a first polarizer, a second polarizer opposite to the first polarizer, and a first black matrix between the first polarizer and the second polarizer;
   the first black matrix corresponds to the non-display area; and
   the decoration portion is between the first polarizer and the second polarizer, and is spaced apart from the first black matrix;
   wherein, the panel body further comprises a color film substrate and an array substrate opposite to the color film substrate;
   the color film substrate and the array substrate are provided between the first polarizer and the second polarizer;
   the first polarizer is located on a side of the color film substrate away from the array substrate;
   the second polarizer is located on a side of the array substrate away from the color film substrate; and
   the first black matrix is between the color film substrate and the array substrate;
   wherein, the decoration portion is between the second polarizer and the array substrate.

2. The display panel of claim 1, wherein the first black matrix is provided on the color film substrate or on the array substrate, and the first black matrix surrounds the display area.

3. The display panel of claim 1, wherein the panel body further comprises a liquid crystal layer between the color film substrate and the array substrate.

4. The display panel of claim 1, wherein a thickness of the decoration portion is between 10 nm and 20 nm.

5. A display device, comprising a display panel of claim 1.

6. A display panel, comprising:
   a panel body comprising a display area and a non-display area around a periphery of the display area; and
   a decoration portion provided on the panel body and located in the display area;
   wherein, the panel body comprises a first polarizer, a second polarizer opposite to the first polarizer, and a first black matrix between the first polarizer and the second polarizer;
   the first black matrix corresponds to the non-display area; and
   the decoration portion is between the first polarizer and the second polarizer, and is spaced apart from the first black matrix;
   wherein, the panel body further comprises a color film substrate and an array substrate opposite to the color film substrate;
   the color film substrate and the array substrate are provided between the first polarizer and the second polarizer;
   the first polarizer is located on a side of the color film substrate away from the array substrate;
   the second polarizer is located on a side of the array substrate away from the color film substrate; and
   the first black matrix is between the color film substrate and the array substrate;
   wherein the decoration portion is between the color film substrate and the array substrate, and is spaced apart from the first black matrix.

7. The display panel of claim 6, wherein the decoration portion is provided on the color film substrate or on the array substrate.

8. A display device, comprising the display panel of claim 6.

* * * * *